United States Patent
Kim et al.

(10) Patent No.: US 7,285,799 B2
(45) Date of Patent: Oct. 23, 2007

(54) SEMICONDUCTOR LIGHT EMITTING DEVICES INCLUDING IN-PLANE LIGHT EMITTING LAYERS

(75) Inventors: James C. Kim, San Jose, CA (US); Yu-Chen Shen, Sunnyvale, CA (US)

(73) Assignee: Philip Lumileds Lighting Company, LLC, San Jose, CA (US)

( * ) Notice: Subject to any disclaimer, the term of this patent is extended or adjusted under 35 U.S.C. 154(b) by 0 days.

(21) Appl. No.: 10/829,141

(22) Filed: Apr. 21, 2004

(65) Prior Publication Data

US 2005/0236627 A1 Oct. 27, 2005

(51) Int. Cl.
 *H01L 27/15* (2006.01)
 *H01L 29/24* (2006.01)
(52) U.S. Cl. .................. 257/79; 257/101; 257/627; 257/628; 257/E33.006; 257/E33.003; 372/45; 372/43; 372/75
(58) Field of Classification Search ........ 257/627–628, 257/101, E33.008, E33.003, 79, E33.006; 372/45, 43, 75
See application file for complete search history.

(56) References Cited

U.S. PATENT DOCUMENTS 6,504,588 B1 * 1/2003 Kaneko ................ 349/71
6,515,313 B1 * 2/2003 Ibbetson et al. ............ 257/103
2002/0031153 A1   3/2002 Niwa et al.
2002/0171092 A1 * 11/2002 Goetz et al. ................ 257/103
2003/0020085 A1 *  1/2003 Bour et al. .................. 257/101
2003/0057434 A1 *  3/2003 Hata et al. .................. 257/103

OTHER PUBLICATIONS

Yue Jun Sun et al., "Polarization anisotropy of the photoluminescence of M-plane (In,Ga)N/GaN multiple quantum wells," Applied Physics Letters, vol. 82, No. 22, Jun. 2, 2003, pp. 3850-3852.
Yue Ju Sun et al., "Nonpolar InxGa1-xN/GaN(1100) multiple quantum wells grown on γ-LIAlO2(100) by plasma-assisted molecular-beam epitaxy," Physical Review B 67, 041306(R) (2003), The American Physical Society, 4 pages.
Arpan Chakraborty et al., "Nonpolar InGaN/GaN emitters on reduced-defect lateral epitaxially overgrown a-plane GaN with drive-current-independent electroluminescence emission peak," Applied Physics Letters, vol. 85, No. 22, Nov. 29, 2004, pp. 5143-5145.

* cited by examiner

*Primary Examiner*—Jerome Jackson
*Assistant Examiner*—Joseph Nguyen
(74) *Attorney, Agent, or Firm*—Patent Law Group LLP

(57) ABSTRACT

A semiconductor light emitting device includes a planar light emitting layer with a wurtzite crystal structure having a <0001> axis roughly parallel to the plane of the layer, referred to as an in-plane light emitting layer. The in-plane light emitting layer may include, for example, a $\{11\bar{2}0\}$ or $\{10\bar{1}0\}$ InGaN light emitting layer. In some embodiments, the in-plane light emitting layer has a thickness greater than 50 Å.

23 Claims, 3 Drawing Sheets

SEMICONDUCTOR LIGHT EMITTING DEVICES INCLUDING IN-PLANE LIGHT EMITTING LAYERS

BACKGROUND

1. Field of Invention

The present invention relates to wurtzite semiconductor light emitting devices.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, a light emitting or active region formed over the n-type layer or layers, and one or more p-type layers doped with, for example, Mg, formed over the active region. One class of UV through green light emitting diodes or short wavelength laser diodes use InGaN/GaN or InGaN/InGaN strained quantum wells to generate light by the recombination of electrons and holes injected from the n- and p-type regions sandwiching the quantum wells.

SUMMARY

In accordance with embodiments of the invention, a semiconductor light emitting device includes a planar light emitting layer with a wurtzite crystal structure having a <0001> axis roughly parallel to the plane of the layer, referred to as an in-plane light emitting layer. The in-plane light emitting layer may include, for example, a $\{11\bar{2}0\}$ or $\{10\bar{1}0\}$ InGaN light emitting layer. In some embodiments, the in-plane light emitting layer has a thickness greater than 50 Å.

DETAILED DESCRIPTION

Figure 1:
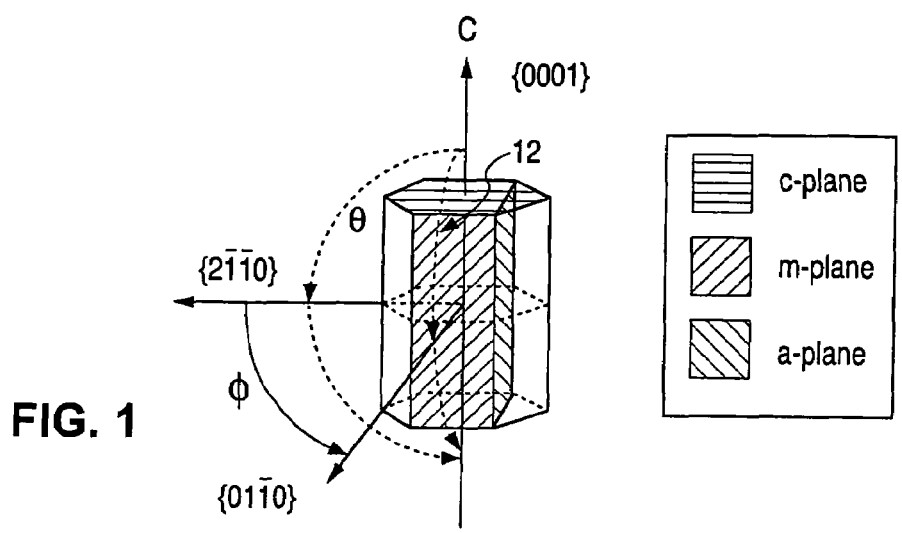
FIG. 1 illustrates the crystal structure of a wurtzite III-nitride semiconductor.

FIG. 1 illustrates a wurtzite crystal GaN structure. III-nitride devices are often grown on the {0001} or c-plane of a sapphire substrate, due to the wide availability and ease of handling such substrates. The resulting III-nitride layers, including the light emitting layer or layers in the active region, are typically {0001} layers, meaning the <0001> axis is perpendicular to the plane of the III-nitride layers. Wurtzite crystal layers of {0001} orientation exhibit both spontaneous and piezoelectric polarization, resulting in sheets of fixed charges at interfaces between {0001} III-nitride layers of different alloy compositions, such as the interfaces between a III-nitride light emitting layer and adjacent layers. The sheet charges produce an electric field across the light emitting layer.

The electric field in a {0001} III-nitride light emitting layer can cause the energy band of the light emitting layer to tilt substantially as the electric potential changes. As a result, the wave functions of the electrons and holes separate spatially from one another, and the overlap integral of the wave functions decrease. Since the optical properties such as the light emission and absorption depend on the overlap integrals, the efficiency of {0001} devices decreases with increasing electric fields.

In accordance with embodiments of the invention, a III-nitride light emitting device is grown such that the crystallographic <0001> direction is roughly parallel to the plane of the light emitting III-nitride layers. Confining the <0001> axis in the plane of the light emitting layers may reduce the electric field across the light emitting layers. A device or crystal layer with the <0001> direction parallel to the plane of the layer or layers is referred to below as an "in-plane" or "in-plane polarized" device or layer, since the c-axis is parallel to or in the plane of the device layers. In some embodiments, the light emitting layer or layers in the active region of a III-nitride device are $<10\bar{1}0>$ or $<11\bar{2}0>$ layers of the quaternary alloy $In_xAl_yGa_{1-x-y}N$ ($0 \leq x \leq 1$, $0 \leq y \leq 1$, $x+y \leq 1$).

Devices with in-plane light emitting layers may be fabricated by growing the device layers on an in-plane growth substrate. Examples of substrates suitable for growth of an in-plane active region include the $\{10\bar{1}0\}$ and $\{11\bar{2}0\}$ surfaces of SiC of the 2H, 4H, or 6H polytypes; the $\{10\bar{1}2\}$ surface of sapphire; and the {100} surface of γ-LiAlO$_2$. In the case of SiC substrates, the orientation of the deposited III-nitride films matches the orientation of the substrate. When using the metal-organic chemical vapor-phase epitaxy technique, the process of depositing the in-plane III-nitride layers is similar to the process used for depositing <0001> III-nitride layers on a <0001> SiC substrate. A buffer layer of AlGaN is deposited, at high temperature (~1100° C.), directly on the SiC substrate. A layer of GaN is deposited on the AlGaN buffer layer. Light-emitting III-nitride quantum wells are deposited on the GaN layer.

In the case of a sapphire substrate with a $\{10\bar{1}2\}$ surface, the deposited III-nitride films are oriented in the $<11\bar{2}0>$ direction. When using the metal-organic chemical vapor-phase epitaxy technique, the process of depositing in-plane III-nitride layers is similar to the process used for depositing <0001> III-nitride layers on a <0001> sapphire substrate. A III-nitride buffer layer is deposited, at low temperature (~550° C.), directly on the sapphire substrate. A layer of GaN is deposited on the III-nitride buffer layer. Light emitting III-nitride quantum wells are deposited on the GaN layer.

In the case of a <100> γ-LiAlO$_2$ substrate, the deposited III-nitride films are oriented in the <10$\bar{1}$0> direction. The process for depositing in-plane III-nitride layers by molecular beam epitaxy consists of depositing a III-nitride buffer layer at low temperature (~550° C.) directly on the substrate, followed by a layer of GaN grown at a higher temperature. The light-emitting III-nitride quantum wells are deposited on the GaN layer.

Figure 2:
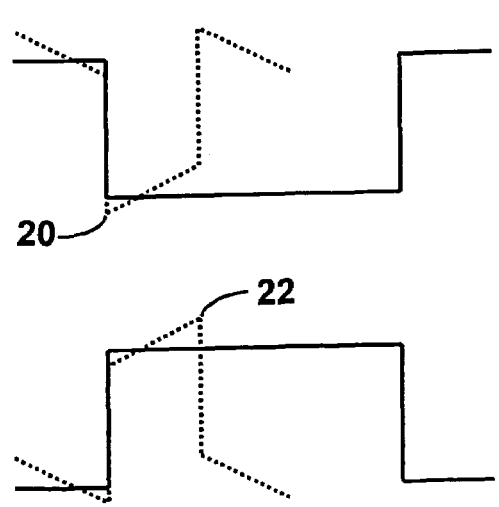
FIG. 2 illustrates a portion of an energy band diagram for a III-nitride device including a {0001} light emitting layer and a III-nitride device including an in-plane light emitting layer.

FIG. 2 illustrates a portion of an energy band diagram for a III-nitride device including a {0001} light emitting layer and a III-nitride device including an in-plane light emitting layer. The dotted line in FIG. 2 illustrates a {0001} light emitting layer where the potential landscape of the quantum well is tilted as shown. Electrons tend to collect at the lowest potential in the conduction band (point 20) and holes at the highest potential in the valence band (point 22), resulting in a spatial offset in the highest concentration of electron and hole carriers. As the thickness of the light emitting layer increases, the potential difference across the light emitting layer increases and the overlap integral of the electron and hole wave functions decreases, reducing the likelihood of radiative recombination of carriers across the offset. As such, in a device with a significant electric field in the light emitting layer such as a {0001} light emitting layer, the electric field effectively limits the thickness of a light emitting layer.

The solid line in FIG. 2 illustrates an in-plane light emitting layer. Since the spontaneous polarization in the light emitting layer is significantly reduced by confining the <0001> axis in the plane of the light emitting layer, the tilt in the energy band diagram is significantly reduced or eliminated. Accordingly, in-plane light emitting layers may be thicker than {0001} light emitting layers without confining carriers on the opposite sides of the quantum wells. In addition, thicker light emitting layers can accommodate more carriers, potentially permitting, for a given internal quantum efficiency, operation at higher current densities than {0001} devices.

A {0001} light emitting layer as illustrated in the dotted line of FIG. 2 may demonstrate good efficiency at thicknesses less than, for example 25 Å, and acceptable efficiency at thicknesses less than, for example, 50 Å. In contrast, in-plane light emitting layers as illustrated in the solid line of FIG. 2 may have a thickness that exceeds 50 Å, and often have a thickness exceeding 90 or 150 Å.

The inventors prepared III-nitride photoluminescence test structures grown on {10$\bar{1}$0} SiC with 90 Å thick quantum wells. The {10$\bar{1}$0} test structures emitted light at about 17% the efficiency of a 25 Å thick {0001} quantum well with the same input laser intensity. In contrast, a test structure with a 90 Å thick {0001} quantum well with the same input laser intensity emitted no light, illustrating that in-plane light emitting layers may be thicker than polarized light emitting layers.

Figure 3:
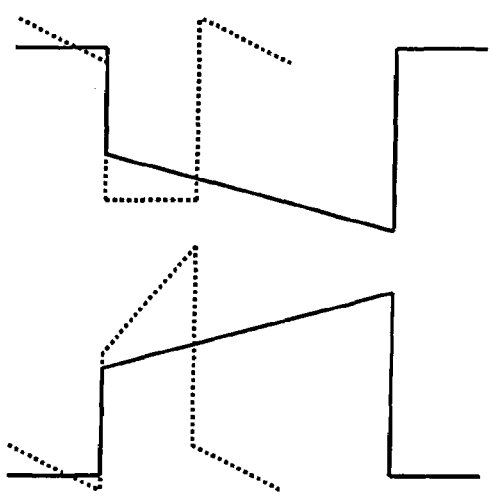
FIG. 3 illustrates a portion of an energy band diagram for a III-nitride device including a {0001} light emitting layer and a III-nitride device including an in-plane light emitting layer.

FIG. 3 illustrates a portion of an energy band diagram for a III-nitride device including a {0001} light emitting layer with a graded band gap, and a III-nitride device including an in-plane light emitting layer with a graded band gap. As in FIG. 2, in FIG. 3 the dotted line represents the {0001} light emitting layer and the solid line represents an in-plane light emitting layer. In each of the devices illustrated in FIG. 3, the band gap across the light emitting layer is graded, for example by grading a composition of InN within an InGaN light emitting layer. The composition of InN within a {0001} light emitting layer may be graded to reduce the offset described above in reference to FIG. 2 by compensating for the tilting of the energy bands caused by polarization within the layer. As illustrated by the dotted line of FIG. 3, one result of such grading is that one band becomes flatter (the conduction band in FIG. 3), while the tilt in the other band increases (the valence band in FIG. 3). Thus, grading in a {0001} light emitting layer must be severe to solve the offset problem described above.

In an in-plane light emitting layer, the composition in the light emitting layer may be graded without encountering the problems in the {0001} light emitting layer described above. Grading an in-plane light emitting layer increases the overlap integral between the electron and hole wave functions. An in-plane light emitting layer may be graded to push both types of carriers to the same side of the light emitting layer. It may be beneficial to grade the light emitting layer where recombination is preferred at one side of the light emitting layer, for example where an interface on one side of the light emitting layer has, for example, more defects available for nonradiative recombination than the interface on the other side of the light emitting layer.

An in-plane light emitting layer may be graded by grading the In composition, in the case of a ternary InGaN or quaternary AlInGaN layer. Ungraded {0001} InGaN light emitting layers emitting blue light generally have an In composition between about 8% and about 12%; layers emitting green light generally have an In composition between about 16% and about 20%. In in-plane graded light emitting layers, the graded In composition may begin, end, or pass through the In compositions described above.

In the case of AlGaN or AlInGaN quantum wells, the composition of Al and/or the composition of In may be graded in the light emitting layers.

Figure 6:
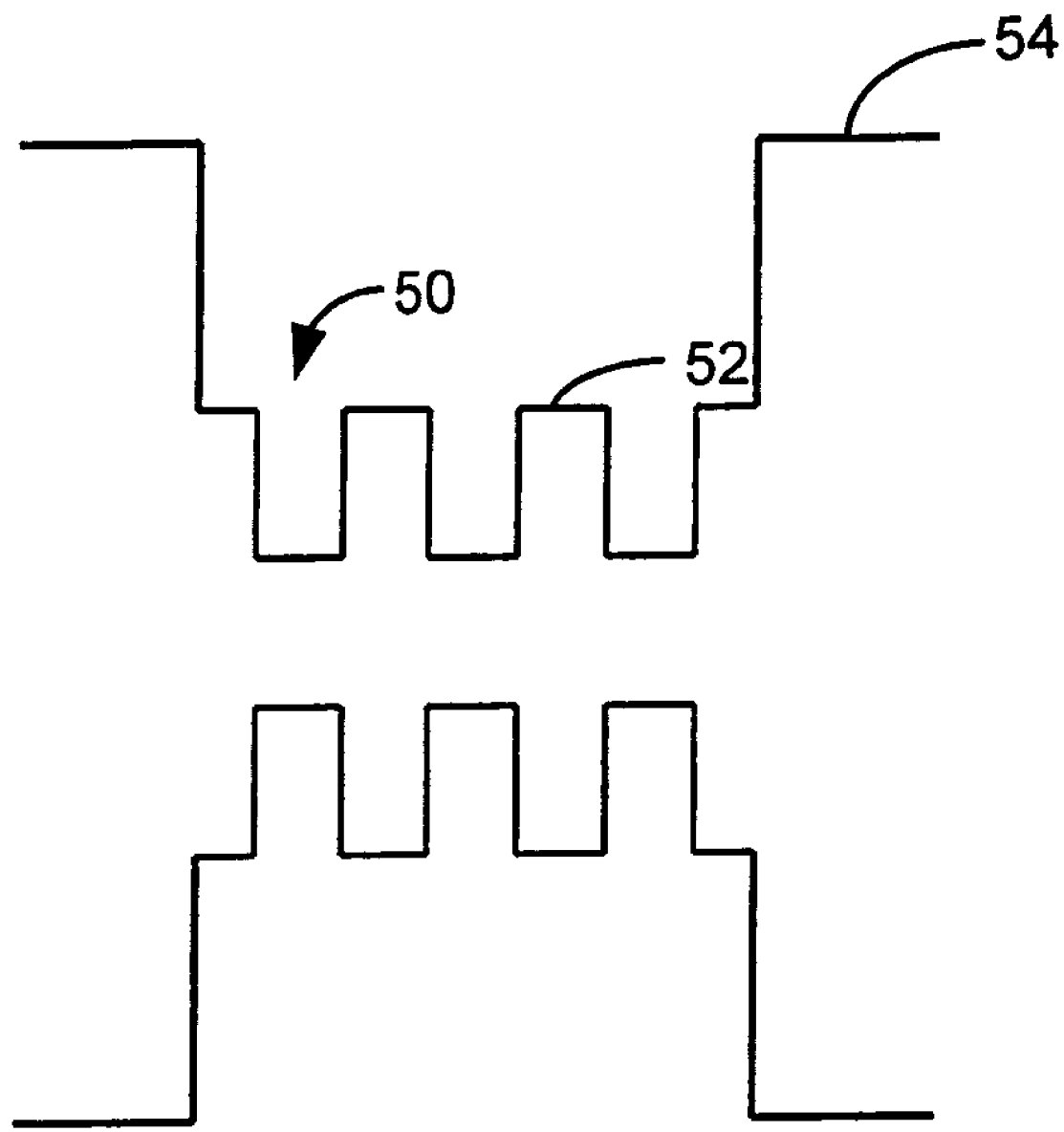
FIG. 6 illustrates a portion of an energy band diagram for a III-nitride device including an in-plane multiple quantum well active region.

In some embodiments, in-plane light emitting layers are included in a multiple quantum well active region as illustrated in FIG. 6. Three quantum wells 50 are separated by barrier layers 52. Cladding layers 54 confine electrons and holes in the active region. Though three quantum wells are illustrated, more or fewer quantum wells may be used. Quantum wells 50 may be thick as described above, and may each have the same or different widths. Quantum wells 50 may have a constant composition, and may each have the same or different composition. One or more of quantum wells 50 may be graded, as described above. In some embodiments barrier layers 52 and/or cladding layers 54 may have a graded composition. Cladding layers may be graded to create a "funnel" into quantum well layers 50. Barriers 52 may have a constant composition, and may each have the same or different composition.

The in-plane light emitting layers described above may be undoped, n-type, or p-type.

In-plane light emitting layers may offer several advantages. First, in-plane light emitting layers may permit devices to be operated at higher current density. In {0001} III-nitride devices, the efficiency of the device generally peaks at a relatively low current density and decreases rapidly as the current density increases. The current density at which {0001} III-nitride devices are operated may be, for example, about 10 A/cm$^2$. The use of in-plane light emitting layers, which may be made thicker than {0001} light emitting layers, may permit devices to be operated at much higher current density, for example, greater than about 100 A/cm$^2$, without experiencing a drop in efficiency.

Second, in-plane light emitting layers may reduce the shift in emission wavelength at high current density. As described above, the electric field in a {0001} III-nitride light emitting layer can cause the energy band of the light emitting layer to tilt substantially. With increasing current density, increasing carrier density in the light emitting layer shields the sheet charges and reverts the tilted bands toward a flat band condition, causing the emission wavelength to shift. A shift in the emission wavelength is undesirable, particularly in the case of a phosphor converted device or a device incorporated in a display. In an in-plane device, the electric field in the light emitting layer is substantially reduced or eliminated. Thus, operation at increasing current density does not appreciably change the potential in the layer, and thus does not appreciably change the emission wavelength of the light.

Figure 4:
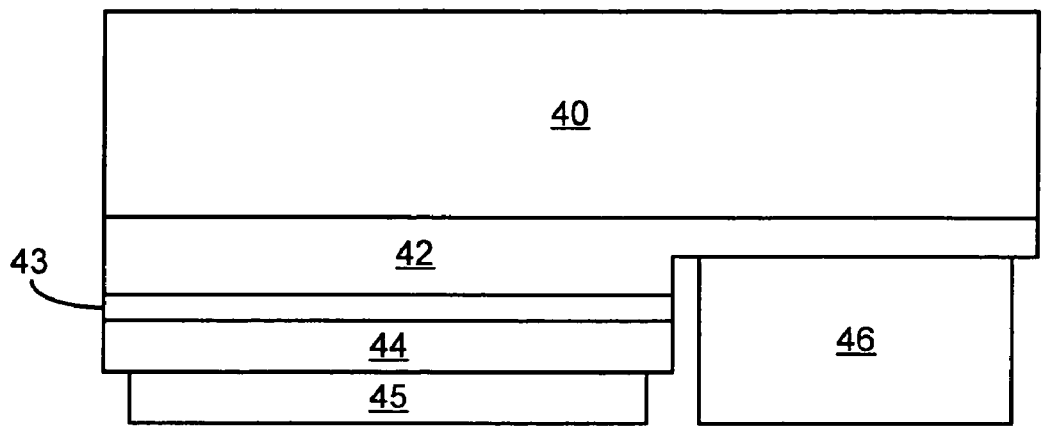
FIGS. 4 and 5 illustrate III-nitride light emitting devices incorporating in-plane light emitting layers.
Figure 5:
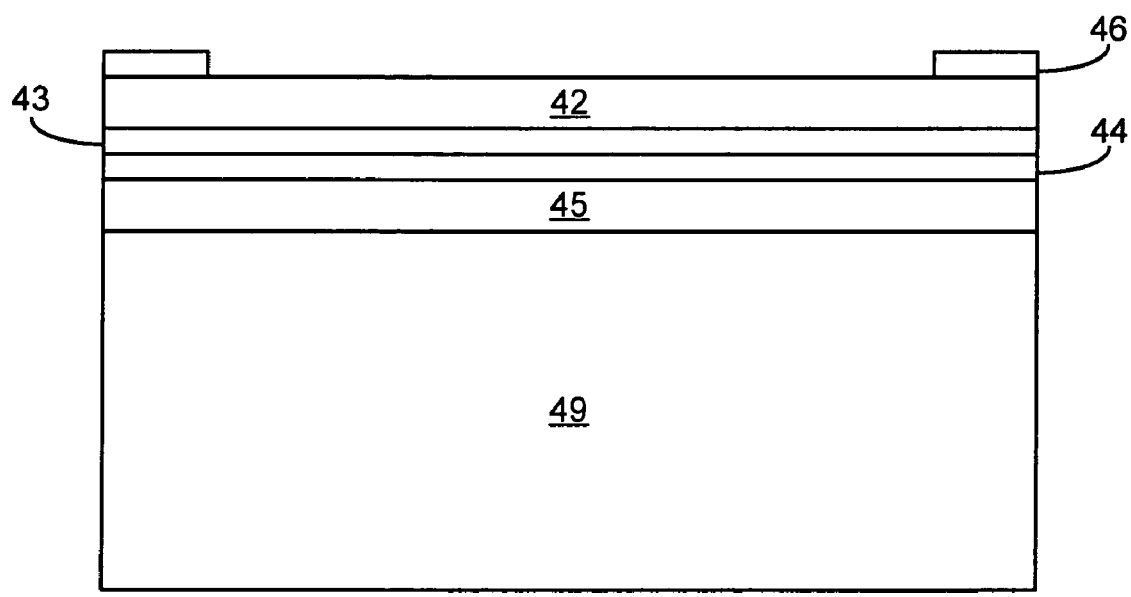

FIGS. 4 and 5 illustrate III-nitride devices including in-plane light emitting layers. In the device of FIG. 4, an n-type region 42 is grown over a suitable growth substrate 40, followed by active region 43 and p-type region 44. Growth substrate 40 may be, for example, the in-plane growth substrates described above, or any other suitable growth substrate. Each of n-type region 42, active region 43, and p-type region 44 may include multiple layers of different composition, thickness, and dopant concentration. For example, n-type region 42 and p-type region 44 may include contact layers optimized for ohmic contact and cladding layers optimized to contain carriers within active region 43. Active region 43 includes at least one in-plane light emitting layer, as described above. Active region 43 may include a single light emitting layer, or may include multiple quantum well light emitting layers separated by barrier layers.

In the device illustrated in FIG. 4, a portion of p-type region 44 and active region 43 are etched away to reveal a portion of n-type region 42. A p-contact 45 is formed on the remaining portion of p-type region 44 and an n-contact 46 is formed on the exposed portion of n-contact 46. Contacts 45 and 46 may be reflective such that light is extracted from the device through the back side of substrate 40. Alternatively, contacts 45 and 46 may be transparent, semi-transparent, or formed in such a way that a large portion of the surfaces of p-type region 44 and n-type region 42 are left uncovered by contacts. In such devices, light may be extracted from the device through the top surface of the epitaxial structure, the surface on which contacts 45 and 46 are formed.

In the device illustrated in FIG. 5, the epitaxial layers are bonded to a host substrate 49 through p-contact 45. Additional layers to facilitate bonding (not shown) may be included between p-type region 44 and host 49. After the epitaxial layers are bonded to host 49, the growth substrate may be removed to expose a surface of n-type region 42. Contact to the p-side of the active region is provided through host 49. An n-contact 46 is formed on a portion of the exposed surface of n-type region 42.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A semiconductor light emitting device comprising a light emitting layer disposed between an n-type region and a p-type region, wherein:
    the light emitting layer comprises a wurtzite crystal structure;
    a <0001> axis is substantially parallel to a top surface of the light emitting layer; and
    the light emitting layer has a thickness greater than 25 Å.

2. The device of claim 1 wherein the light emitting layer has a thickness greater than 50 Å.

3. The device of claim 1 wherein the light emitting layer has a thickness greater than 90 Å.

4. The device of claim 1 wherein the light emitting layer has a thickness greater than 150 Å.

5. The structure of claim 1 wherein the light emitting layer comprises {11$\bar{2}$0} InGaN.

6. The structure of claim 1 wherein the light emitting layer comprises {10$\bar{1}$0} InGaN.

7. The structure of claim 1 wherein the light emitting layer comprises one of AlGaN and AlInGaN.

8. The device of claim 1 wherein a composition of indium in the light emitting layer is graded from a first indium composition in a first portion of the light emitting layer proximate the n-type region to a second indium composition in a second portion of the light emitting layer proximate the p-type region.

9. The device of claim 8 wherein the first composition is greater than the second composition.

10. The device of claim 8 wherein the first composition is less than the second composition.

11. The device of claim 8 wherein a composition of aluminum in the light emitting layer is graded from a first aluminum composition in a first portion of the light emitting layer proximate the n-type region to a second aluminum composition in a second portion of the light emitting layer proximate the p-type region.

12. The device of claim 1 wherein a composition of aluminum in the light emitting layer is graded from a first aluminum composition in a first portion of the light emitting layer proximate the n-type region to a second aluminum composition in a second portion of the light emitting layer proximate the p-type region.

13. The device of claim 12 wherein the first composition is greater than the second composition.

14. The device of claim 12 wherein the first composition is less than the second composition.

15. The device of claim 1 wherein the light emitting layer is a first quantum well, the device further comprising:
    a second quantum well; and
    a barrier layer disposed between the first and second quantum well;
    wherein the first quantum well, second quantum well, and barrier layer form an active region.

16. The device of claim 15 wherein an indium composition in one of the first and second quantum wells is graded.

17. The device of claim 15 wherein the barrier layer has a graded composition.

18. The device of claim 15 further comprising first and second cladding layers, wherein the active region is disposed between first and second cladding layers.

19. The device of claim 18 wherein the first and second cladding layers have a larger band gap than the first and second quantum wells.

20. The device of claim 18 wherein:
    each of the first and second cladding layers is graded from a first band gap in a portion of the cladding layers adjacent to the active region to a second band gap in a portion of the cladding layers spaced apart from the active region; and
    the second band gap is greater than the first band gap.

21. The device of claim 20 wherein a composition of indium in the first and second cladding layers is graded.

22. The device of claim 1 wherein the device operates at a current density greater than 10 A/cm$^2$.

23. The device of claim 1 wherein the device operates at a current density greater than 100 A/cm$^2$.

* * * * *